(12) United States Patent
Igarashi et al.

(10) Patent No.: US 8,765,833 B2
(45) Date of Patent: Jul. 1, 2014

(54) UV-CURABLE OPTICAL RESIN ADHESIVE COMPOSITION

(75) Inventors: Kazumasa Igarashi, Ibaraki (JP); Yuki Hasegawa, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 0 days.

(21) Appl. No.: 13/359,982

(22) Filed: Jan. 27, 2012

(65) Prior Publication Data

US 2012/0214896 A1 Aug. 23, 2012

(30) Foreign Application Priority Data

Feb. 22, 2011 (JP) ................................. 2011-035571

(51) Int. Cl.
| | | |
|---|---|---|
| C03C 25/10 | (2006.01) | |
| C08G 18/67 | (2006.01) | |
| C08J 3/28 | (2006.01) | |
| C08F 2/46 | (2006.01) | |
| C08G 61/04 | (2006.01) | |

(52) U.S. Cl.
USPC ................... 522/96; 522/90; 522/113; 522/1; 520/1

(58) Field of Classification Search
USPC ................ 522/96, 90, 113, 1; 520/1
See application file for complete search history.

(56) References Cited

U.S. PATENT DOCUMENTS

| | | | |
|---|---|---|---|
| 5,089,101 A | 2/1992 | Hayashi et al. | |
| 2006/0223938 A1* | 10/2006 | Nagamoto et al. | 524/556 |
| 2008/0026182 A1* | 1/2008 | Abe et al. | 428/141 |
| 2009/0186552 A1 | 7/2009 | Shinya et al. | |
| 2009/0209089 A1* | 8/2009 | Murata et al. | 438/465 |
| 2009/0296033 A1 | 12/2009 | Shinya et al. | |
| 2010/0003425 A1 | 1/2010 | Kamata et al. | |
| 2010/0033661 A1* | 2/2010 | Shinya et al. | 349/122 |
| 2010/0043965 A1 | 2/2010 | Kamiya et al. | |
| 2010/0097552 A1 | 4/2010 | Shinya et al. | |
| 2010/0097746 A1 | 4/2010 | Toyoda et al. | |
| 2010/0098839 A1 | 4/2010 | Toyoda et al. | |
| 2010/0118245 A1 | 5/2010 | Toyoda et al. | |
| 2010/0129989 A1* | 5/2010 | Kamiya et al. | 438/464 |
| 2010/0134713 A1 | 6/2010 | Toyoda et al. | |
| 2010/0178834 A1 | 7/2010 | Toyoda et al. | |
| 2010/0197187 A1 | 8/2010 | Naraba et al. | |
| 2010/0210166 A1 | 8/2010 | Toyoda et al. | |
| 2012/0115976 A1 | 5/2012 | Igarashi et al. | |

FOREIGN PATENT DOCUMENTS

| | | | |
|---|---|---|---|
| EP | 2090633 A1 | 8/2009 | |
| EP | 2144219 A1 | 1/2010 | |
| EP | 2169449 A1 | 3/2010 | |
| JP | 2008-169319 A | 7/2008 | |
| JP | 2008-260813 | * | 10/2008 |
| JP | 2008-260813 A | 10/2008 | |
| JP | 2008-281997 A | 11/2008 | |
| JP | 2009-008851 A | 1/2009 | |
| JP | 2012-117028 A | 6/2012 | |

OTHER PUBLICATIONS

Extended European Search Report dated Aug. 7, 2013, issued in corresponding European Patent Application No. 12154441.5 (6 pages).
Chinese Office Action dated Jan. 24, 2014, issued in corresponding Chinese application No. 201210030868.7, w/ English translation (15 pages).
Japanese Office Action dated Apr. 22, 2014, issued in corresponding Japanese application No. 2011-035571, w/ English translation (4 pages).

* cited by examiner

*Primary Examiner* — Ling Choi
*Assistant Examiner* — Jessica E Whiteley
(74) *Attorney, Agent, or Firm* — Westerman, Hattori, Daniels & Adrian, LLP

(57) ABSTRACT

A UV-curable optical resin adhesive composition is provided having excellent transparency, adhesion reliability, and durability without causing any adverse affect on image qualities such as luminance and contrast, and suitable for a reworking (repairing) process. The UV-curable optical resin adhesive composition fills a gap between an image display panel and a protective cover plate. The UV-curable optical resin adhesive composition contains, a urethane acrylate-based polymer (A) having a (meth) acryloyl group and a hydroxyl group on side chains thereof, and a photopolymerization initiator (B).

3 Claims, No Drawings

UV-CURABLE OPTICAL RESIN ADHESIVE COMPOSITION

BACKGROUND OF THE INVENTION

1. Field of the Invention

The present invention relates to a UV-curable optical resin adhesive composition, which is used in a display structure including a protective cover plate and an image display panel being stacked and bonded together, for filling a gap therebetween, and imparts excellent image display quality, transparency, adhesion reliability, and durability to the display structure while keeping luminosity and high contrast of the display structure. Such UV-curable optical resin adhesive composition can be suitable for reworking (repairing) the display structure.

2. Description of the Related Art

In recent years, along with evolution of the advanced information society, many functional devices have been proposed including image display panels such as an organic electroluminescence (EL) display device, and a liquid crystal display device, various electronic devices for display such as an electrophoretic display device, optical devices such as an organic EL illumination device, an optical element, and an optical waveguide, and solar cells such as a thin film silicon solar cell, an organic thin film solar cell, and a dye-sensitized solar cell.

Particularly in the liquid crystal display devices, in recent years, there is a tendency to be enlarged in size and screen, such as, for example, wide-screen HD TVs and 3-D TVs. In those liquid crystal display devices, a structure called an air-gap structure (hollow structure) with a gap of approximately 0.5 to 1.5 mm has been conventionally adopted and formed between a liquid crystal display (LCD) panel (LCD module) and a protective cover plate (front cover made of glass, an acrylic resin, or the like) to protect the surface of the LCD panel as well as to act as a polarizing plate (see Japanese Patent Application Laid-open No. 2009-8851). However, with respect to the refractive index of the air in the above-mentioned air gap structure portion, a combination of the LCD panel (LCD module) and the protective cover plate (front cover) with various polarizing plates has a refractive index of approximately 1.5. Thus, generally, luminance and contrast are inevitably decreased due to diffusion or scattering of image light in the panel, which is emitted from the LCD module, reflection of outside light such as sunlight, and the like. Therefore, the resulting images are not always satisfied, and hence image display with higher quality has been demanded.

For this reason, it is suggested to fill a transparent optical resin having a refractive index close to that of glass or an acrylic resin into the above-mentioned air gap structure portion (see, for example, Japanese Patent Application Laid-open No. 2008-281997). Thus, the above-mentioned air gap is filled with the optical resin to eliminate the optical interface between the LCD panel (LCD module) and the protective cover plate (front cover). This leads to a reduction in reflection/diffusion of image light, and the reduction largely contributes to improvements in luminance and contrast. As a result, high quality images can be now provided. Further, the strength of the entire image display device can be increased by filling the above-mentioned air gap with the optical resin. In other words, glass, which is a formation material, can be prevented from being scattered even if the protective cover plate (front cover) is broken, while an improvement in strength of the image display device can be simultaneously attained.

SUMMARY OF THE INVENTION

However, in the fabrication of an image display device including a liquid crystal display panel and a touch panel plate, a protective cover plate, a lens plate, and the like arranged on the liquid crystal display panel, the resulting image display device itself should be discarded when misalignment of those plates occurs during the process of bonding them one on another, thereby causing a problem of large economic loss. In particular, the unit price of a large-sized image display device itself is higher than the usual one. Thus, an increase in yield of the production has been attempted and a defect has been inevitably subjected to repair when the defect occurs. Therefore, when the image display device whose assembly has already been completed is defective and requires repair, a reworking (repairing) process has been employed. This process includes: cutting an adhesive layer, which is made of an optical resin adhesive composition and applied between a LCD panel (LCD module) and a protective cover plate (front cover made of glass, an acrylic resin, or the like), from the end surface of the above-mentioned adhesive layer to the center thereof using an ultrafine wire; expanding and removing a cured resin residue using a solvent after the cutting; and forwarding the components to an assembling process again.

By the way, conventionally, a UV-curable optical resin adhesive composition formed primarily of a polyurethane acrylate-based main-chain polymer, a polyisoprene acrylate-based main-chain polymer, or a polybutadiene acrylate-based main-chain polymer, and monomeric (meth)acrylate has been proposed as the above-mentioned optical resin adhesive composition. In this case, linear hydrocarbon-based solvents such as hexane and heptane, aromatic hydrocarbon-based solvents such as toluene and xylene, and the like which have close solubility parameter (SP) values have each been frequently used as a solvent for expanding and removing a resin residue after cutting into each panel described above with an ultrafine wire. However, any of those hydrocarbon-based solvents has a problem of damaging various polarizing plates because the solvent also gradually penetrates and expands in a nonpolar cycloolefin polymer (COP), which is a material for forming a diffuser, a retardation film, or a protective film to be used in each of the polarizing plates. In addition, even when other adhesive compositions formed of polymers other than those described above are used, there is a problem in that expansion of a resin residue takes a long time. In other words, the development of an optical resin adhesive composition that easily allows repair (rework) with an expansion solvent for a resin residue without any adverse affect on each plate, a structural component in the image display device, has been strongly demanded.

A UV-curable optical resin adhesive composition is herein provided having excellent transparency, adhesion reliability, and durability without causing any adverse affect on image qualities such as luminance and contrast. Such UV-curable optical resin adhesive composition is suitable for a reworking (repairing) process and is capable of preventing liquid pollution even at the time of bonding panels one on top of the other.

The UV-curable optical resin adhesive composition is an optical resin adhesive composition for filling a gap between an image display panel and a protective cover plate, including, a urethane acrylate-based polymer (A) having a (meth)acryloyl group and a hydroxyl group on side chains thereof, and a photopolymerization initiator (B).

An adhesive that has excellent transparency and adhesion reliability, facilitates the expansion and removal of a cured resin residue with a solvent, and is suitable for a reworking (repairing) process can be obtained when an optical resin composition including a urethane acrylate-based polymer (A) having a (meth)acryloyl group and a hydroxyl group on side chains thereof, and a photopolymerization initiator (B) is used.

That is, the polymer has the following advantage as a result of the use of the above-mentioned urethane acrylate-based polymer (A) having a (meth)acryloyl group and a hydroxyl group on side chains thereof. Unlike, in particular, a conventional polymer having a three-dimensional cross-linkage at a terminal thereof such as typical urethane acrylate, where (meth)acrylates are introduced into the terminals of polyurethane made of polyols and isocyanates, a urethane acrylate-based polymer having a (meth)acryloyl group and a hydroxyl group is capable of forming a three-dimensional crosslink at a side chain thereof. Thus, the urethane acrylate-based polymer does not require the use of any multifunctional (meth) acrylate in a reactive diluent. Therefore, just as in a typical adhesive composition using urethane acrylate and multifunctional (meth)acrylates, the adhesive composition exerts technical superiority in avoiding adverse affects such as a significant reduction in expanding performance and a significant increase in cure shrinkage due to an excessive increase in crosslink density.

Further, simultaneously, a high viscous composition liquid of a UV-curable optical resin adhesive composition where the above-mentioned urethane acrylate-based polymer (A) having a (meth)acryloyl group and a hydroxyl group on side chains thereof has a weight average molecular weight of 5,000 to 500,000 (suitably a composition liquid with a viscosity of 50,000 to 70,000 mPa·s) is applied to the adhesive surface of a panel substrate of one of two plates (hereinafter, also referred to as a first panel substrate) so as to form a dam along the circumference of the adhesive surface. Then, the composition liquid is slightly cured with UV. Subsequently, a low viscous composition liquid where the UV-curable optical resin adhesive composition where the above-mentioned urethane acrylate-based polymer (A) having a (meth)acryloyl group and a hydroxyl group on side chains thereof has a weight average molecular weight of 5,000 to 500,000 is diluted with a monofunctional monomer or the like (suitably a composition liquid with a viscosity of 2,000 to 3,000 mPa·s) is applied to fill the inner peripheral area formed by the above-mentioned dam (inner side of the adhesive surface) of the first panel substrate on which the above-mentioned dam has been formed. After that, the first panel substrate is aligned with another panel substrate (hereinafter, also referred to as a second panel substrate). Subsequently, when the panel substrates are bonded together under vacuum or are bonded together under ordinary pressure, the above-mentioned low viscous composition liquid (UV-curable optical resin adhesive composition liquid) can be prevented from leaking from the side of the bonded panel substrates. The prevention further contributes to an increase in yield of the product.

As described in the foregoing, the present invention is a UV-curable optical resin adhesive composition containing, the urethane acrylate-based polymer (A) having a (meth) acryloyl group and a hydroxyl group on side chains thereof, and the photopolymerization initiator (B). Therefore, the panel side can be prevented from being polluted with liquid leakage at the time of bonding the panel substrates together, and characteristics excellent transparency and adhesiveness as well as excellent reworking (repairing) workability are obtained. Therefore, the UV-curable optical resin adhesive composition is very useful as an interlayer filling material for filling a gap between an image display panel and a protective cover plate of an organic EL display device, a liquid crystal display device, or the like.

Further, when the above-mentioned specific urethane acrylate-based polymer (A) has a weight average molecular weight of 5,000 to 500,000, the optical resin composition is provided with improved coating property as well as further improved strength, adhesiveness, weather resistance, and solvent/chemical resistance.

Further, the viscosity of the optical resin composition decreases as long as the UV-curable optical resin adhesion composition of the present invention includes any of monofunctional (meth)acrylate compounds as a reactive diluent. As a result, the coating property of such composition improves, and the adhesion property of a cured body to be formed also improves.

DETAILED DESCRIPTION OF THE INVENTION

Hereinafter, embodiments of the present invention are described in detail. However, the present invention is not limited to these embodiments.

A UV-curable optical resin adhesive composition (hereinafter, also referred to as "optical resin adhesive composition" or simply "adhesive composition") is prepared using a specific urethane acrylate-based polymer (component A) and a photopolymerization initiator (component B) as essential components.

Then, the UV-curable optical resin adhesive composition is used for filling the gap between an image display panel and a protective cover plate (front cover). More specifically, such composition is used as an interlayer filling material for filling a hollow structure (air gap structure) formed of a gap of approximately 0.5 to 1.5 mm between the image display panel and the protective cover plate (front cover) such as glass or an acrylic resin. In general, a spacer is formed between the image display panel and the protective cover plate described above to form a hollow structure between the image display panel and the protective cover plate (front cover). The above-mentioned spacer may be linearly or spherically formed. Alternatively, the spacer may be fixed with an adhesive. In any case, the spacer has only to be capable of filling a gap of approximately 0.5 to 1.5 mm between the image display panel and the protective cover plate.

It should be noted that, the term "(meth)acryloyl" means one of an acryloyl and a methacryloyl, the term "(meth) acrylate" means one of an acrylate and a methacrylate, the term "(meth)acrylic acid" means one of acrylic acid and methacrylic acid, and the term "(meth)acryloxy" means one of an acryloxy and a methacryloxy.

The above-mentioned specific urethane acrylate-based polymer (component A), includes a (meth)acryloyl group and a hydroxyl group on side chains thereof. For instance, the polymer is obtained by reacting a vinyl polymer containing a hydroxyl group on a side chain thereof with (meth)acryloyl group-containing monoisocyanate compounds and a diisocyanate-type compound.

For example, the above-mentioned vinyl polymer containing a hydroxyl group on a side chain thereof is a vinyl polymer prepared by a high-temperature continuous polymerization method using a vinyl monomer containing a hydroxyl group and a vinyl monomer having no hydroxyl group or another vinyl monomer. In addition, the above-mentioned vinyl polymer containing a hydroxyl group on a side chain thereof is preferably a liquid random copolymer having a weight average molecular weight of 500 to 20,000 and a hydroxyl equivalent (OHV) of approximately 5 to 200 mgKOH/g. Specific examples of the vinyl polymer include those described in Japanese Patent Application Laid-open No. Hei 7-101902 and Japanese Patent Application Laid-open No. 2001-348560.

A hydroxyl group-containing (meth)acrylate is used as the above-mentioned vinyl monomer containing a hydroxyl group, and examples thereof include 2-hydroxyethyl(meth)acrylate, 4-hydroxybutyl(meth)acrylate, hydroxypropyl(meth)acrylate, pentaerythritol(meth)acrylate, and glycerin(meth)acrylate. Those hydroxyl group-containing (meth)acrylates may be used alone or in combination of two or more kinds thereof. Of those, a hydroxyethyl(meth)acrylate is preferably used from the viewpoint of a satisfactory random copolymerizability.

A (meth)acrylic acid ester is used as the above-mentioned vinyl monomer having no hydroxyl group, and examples thereof include monofunctional (meth)acrylates such as methyl(meth)acrylate, ethyl(meth)acrylate, propyl(meth)acrylate, isopropyl(meth)acrylate, butyl(meth)acrylate, isobutyl(meth)acrylate, t-butyl(meth)acrylate, isooctyl(meth)acrylate, neopentyl(meth)acrylate, 2-ethylhexyl(meth)acrylate, isodecyl(meth)acrylate, lauryl(meth)acrylate, styryl(meth)acrylate, isobonyl(meth)acrylate, dicyclopentanyl(meth)acrylate, tricyclodecyl(meth)acrylate, tetrahydrofurfuryl(meth)acrylate, glycidyl(meth)acrylate, cyclohexyl(meth)acrylate, 2-methoxyethyl(meth)acrylate, dimethylaminoethyl(meth)acrylate, chloroethyl(meth)acrylate, and trifluoroethyl(meth)acrylate. Those (meth)acrylic acid esters may be used alone or in combination of two or more kinds thereof. Of those, butyl(meth)acrylate, 2-ethylhexyl(meth)acrylate, lauryl(meth)acrylate, and cyclohexyl(meth)acrylate, in each of which the ester moiety of a (meth)acrylate has 1 to 20 carbon atoms, are suitably used from the viewpoint of the simultaneous pursuit of flexibility and tack-free property in the resultant cured product.

Examples of the above-mentioned another vinyl monomer include crotonic acid esters, α-olefins, chloroethylenes, vinyl ethers, vinyl esters, isopropenyl ethers, allyl ethers, allyl esters, an aromatic vinyl monomer, and (meth)acrylic acid. Those vinyl monomers may be used alone or in combination of two or more kinds thereof.

The ratio of usage of the vinyl monomer containing a hydroxyl group and the vinyl monomer containing no hydroxyl group described above may be defined by arbitrarily setting a blending ratio of the respective monomers to be reacted so that the vinyl polymer containing a hydroxyl group on a side chain thereof to be obtained may be a liquid random copolymer having a hydroxyl equivalent (OHV) of approximately 5 to 200 mgKOH/g. This is because of the following reasons. In other words, when the hydroxyl equivalent (OHV) is too small, the following tendency is observed. The UV-curable optical resin adhesive composition obtained causes an insufficient cross-linking density of a cured body, which readily leads to a lack in strength as well as inability to exert sufficient transparency, adhesive resistance, and solvent/chemical resistance. Further, when the hydroxyl equivalent (OHV) is too high, the following tendency is observed. The cured body made of the UV-curable optical resin adhesive composition obtained is apt to have a high glass transition temperature (Tg) and a high elastic modulus, and as a result, the cured body is unable to exert sufficient adhesiveness.

The vinyl polymer containing a hydroxyl group on a side chain thereof obtained using the respective monomers described above is obtained by a continuous polymerization method at a high temperature (for example, 150 to 350° C.), and a vinyl polymer having a weight average molecular weight of 500 to 20,000 is obtained. Of such polymers, from the viewpoints of strength, adhesiveness, weather resistance, and solvent/chemical resistance as well as coating property, a liquid vinyl polymer having a weight average molecular weight of 1,000 to 15,000 is preferred. In addition to the foregoing description, the term "weight average molecular weight" refers to a polystyrene-equivalent weight average molecular weight measured by gel permeation chromatography (GPC).

Meanwhile, examples of the (meth)acryloyl group-containing monoisocyanate compounds include (meth)acryloxy-isocyanate compounds such as 2-isocyanatoethyl methacrylate, 2-isocyanatoethyl acrylate, and 1,1-bis(acryloxymethyl)ethyl isocyanate. Those (meth)acryloyl group-containing monoisocyanate compounds may be used alone or in combination of two or more kinds thereof. Of those, 2-isocyanatoethyl methacrylate is preferably used from the viewpoint of the simultaneous pursuit of hardness and tack-free property in the resultant cured product.

In addition, examples of the diisocyanate-type compound include hexamethylene diisocyanate, norbornene diisocyanate, isophorone diisocyanate, xylylene diisocyanate, hydrogenated xylylene diisocyanate, dicyclohexylmethane diisocyanate, tolylene diisocyanate, diphenylmethane diisocyanate, and naphthalene diisocyanate. Those diisocyanate-type compounds may be used alone or in combination of two or more kinds thereof. Of those, saturated diisocyanates such as hexamethylene diisocyanate, norbornene diisocyanate, isophorone diisocyanate, hydrogenated xylylene diisocyanate, and dicyclohexylmethane diisocyanate are suitably used from the viewpoint of a small degree of yellow discoloration in the resultant cured product.

As described above, the specific urethane acrylate-based polymer (A component) is obtained by reacting a vinyl polymer containing a hydroxyl group on a side chain thereof with (meth)acryloyl group-containing monoisocyanate compounds and a diisocyanate-type compound. In addition, this synthesis process is performed by reacting the components while increasing their temperature from room temperature (approximately 20° C.) to possibly 30-80° C. under an inert gas atmosphere in the presence of a catalyst such as a metal such as titanium or tin, or an organic metal salt such as dibutyltin laurate, thereby resulting in a urethane acrylate-based polymer (component A) having a (meth)acryloyl group and a hydroxyl group on side chains thereof, the polymer being viscous substantially at room temperature (25±15° C.).

Further, the above-mentioned urethane acrylate-based polymer (A) having a (meth)acryloyl group and a hydroxyl group on side chains thereof can be obtained as described below. That is, the isocyanate compounds are mixed so that at least 5 to 50 mol % of hydroxyl groups may remain with respect to the number of hydroxyl groups of the above-mentioned vinyl polymer containing the hydroxyl groups on side chains thereof. In other words, the number of isocyanate groups of the (meth)acryloyl group-containing monoisocyanate compounds is set to 0.1 to 50.0 mol % and the number of isocyanate groups of the diisocyanate-type compound is set to 30 to 70 mol %, and then reacted as described above. The reaction results in a urethane acrylate-based polymer having a (meth)acryloyl group and a hydroxyl group on side chains thereof. Further, more preferably, the isocyanate-type compounds are mixed together so that the number of isocyanate groups of the above-mentioned (meth)acryloyl group-containing monoisocyanate compounds may be 10 to 20 mol % and the number of isocyanate groups of the diisocyanate-type compound may be 40 to 60 mol % to leave 10 to 40 mol % of the hydroxyl group. Particularly preferably, the isocyanate-type compounds are mixed together so that the number of isocyanate groups of the above-mentioned (meth)acryloyl group-containing monoisocyanate compounds may be 10 to 15 mol % and the number of isocyanate groups of the diisocyanate-type compound may be 45 to 55 mol % to leave 30 to 40 mol % of the hydroxyl group.

The urethane acrylate-based polymer obtained as described above, the polymer having a (meth)acryloyl group and a hydroxyl group on side chains and serving as a specific urethane acrylate-based polymer (component A), has preferably a weight average molecular weight of 5,000 to 500,000, and particularly preferably a weight average molecular weight of 50,000 to 200,000. The cured body of the optical resin adhesive composition prepared using the specific urethane acrylate-based polymer (component A) has such an advantage as to be provided with a cross-linkage in a molecule thereof when the polymer has a weight average molecular weight within the above-mentioned range. Accordingly, the above-mentioned range is preferred because transparency, adhesion reliability, and durability are realized, and low curing contractility is obtained as a result of the high crosslink density. Further, the optical resin adhesive composition has a hydroxyl group as well as a (meth)acryloyl group on a side chain thereof, and hence the resulting cured body is also provided with an advantage of a further increase in adhesive reliability. Further, the main chain skeleton of the cured body to be formed is a urethane acrylate-based polymer, and hence the cured body can be excellent in weather resistance. Besides, a swelling solvent can be selected from various solvents that show non-etching properties to nonpolar cycloolefin polymers (COPs), which are materials for forming a diffuser, a retardation film, and a protective film to be used in a polarizing plate. Here, the above-mentioned term "weight average molecular weight" refers to a polystyrene-equivalent weight average molecular weight measured by gel permeation chromatography (GPC).

For instance, a characteristic absorption band (approximately 2,260 $cm^{-1}$) derived from an isocyanate group decreases with the progress of a reaction for synthesizing the above-mentioned specific urethane acrylate-based polymer (component A) in an infrared absorption spectrum. Accordingly, the degree of progress of alteration in the reaction can be confirmed by measuring the characteristic absorption band derived from an isocyanate group. In addition, the end point of the alteration in the synthesis reaction can be confirmed when the characteristic absorption band derived from an isocyanate group disappears.

Further, the photopolymerization initiator (component B) to be used in combination with the above-mentioned specific urethane acrylate-based polymer (component A) is one that acts as an ultraviolet (UV) curing agent, and any of various photopolymerization initiators such as a photoradical polymerization initiator and a photocationic polymerization initiator is used. A photoradical polymerization initiator is more suitably used when a touch panel where transparent electrodes are formed of indium tin oxide (ITO) or the like is used in a liquid crystal display device in order that the corrosion of ITO to be caused by ions (particularly, counter anions) derived from the photopolymerization initiator may be avoided.

Examples of the above-mentioned photoradical polymerization initiator include 2,2-dimethoxy-1,2-diphenylethan-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propane, 2-hydroxy-1-{4-[4-(2-hydroxy-2-methyl-propionyl)-benzyl]phenyl}-2-methyl-propan-1-one, 2-benzyl-2-dimethylamino-1-(4-morpholinophenyl)-butanone-1,2-methyl-1-(4-methylthiophenyl)-2-morpholinopropan-1-one, bis(2,4,6-trimethylbenzoyl)-phenylphosphine oxide, 2,4,6-trimethyl-benzoyl-diphenyl-phosphine oxide, bis($\eta$5-2,4-cyclopentadien-1-yl)-bis[2,6-difluoro-3(1H-pyrrol-1-yl)-phenyl] titanium, and 2-hydroxy-1-{4-[4-(2-hydroxy-2-methyl-propionyl)-benzyl]phenyl}-2-methyl-propan-1-one. Those photoradical polymerization initiators may be used alone or in combination of two or more kinds thereof. Of those, 2,2-dimethoxy-1,2-diphenylethan-1-one, 1-hydroxy-cyclo-hexyl-phenyl-ketone, and 2-hydroxy-1-{4-[4-(2-hydroxy-2-methyl-propionyl)-benzyl]phenyl}-2-methyl-propan-1-one are preferably used from the viewpoints of a high curing rate and thick film curing property.

The amount of the above-mentioned photopolymerization initiator added is preferably set to a range of preferably 0.1 to 30% by weight, more preferably 0.5 to 20% by weight of the whole UV-curable optical resin adhesive composition. This is because of the following reasons. When the amount of the photopolymerization initiator added is too small, the degree of polymerization tends to be insufficient. When the amount is too large, the following tendency is observed. The amount of the residue caused by degradation becomes large. A decrease in durability of the UV-curable optical resin adhesive composition occurs, and the solvent/chemical resistance decreases.

The UV-curable optical resin adhesive composition may contain various monofunctional (meth)acrylate compounds as reactive diluents. Examples of the above-mentioned monofunctional (meth)acrylate compounds include monofunctional (meth)acrylates such as methyl(meth)acrylate, ethyl (meth)acrylate, propyl(meth)acrylate, isopropyl(meth) acrylate, butyl(meth)acrylate, isobutyl(meth)acrylate, t-butyl (meth)acrylate, isooctyl(meth)acrylate, neopentyl(meth) acrylate, 2-ethylhexyl(meth)acrylate, isodecyl(meth) acrylate, lauryl(meth)acrylate, styryl(meth)acrylate, isobonyl(meth)acrylate, dicyclopentanyl(meth)acrylate, tricyclodecyl(meth)acrylate, tetrahydrofurfuryl(meth)acrylate, glycidyl(meth)acrylate, cyclohexyl(meth)acrylate, 2-methoxyethyl(meth)acrylate, dimethylaminoethyl(meth)acrylate, chloroethyl(meth)acrylate, trifluoroethyl(meth)acrylate, 2-hydroxyethyl(meth)acrylate, 4-hydroxybutyl(meth)acrylate, hydroxypropyl(meth)acrylate, pentaerythritol(meth) acrylate, and glycerin(meth)acrylate. Those monofunctional (meth)acrylate compounds may be used alone or in combination of two or more kinds thereof. Of those, for example, tetrahydrofurfuryl(meth)acrylate and glycidyl(meth)acrylate, in each of which the ester moiety of a (meth)acrylate is a cyclic ether, and 2-hydroxyethyl(meth)acrylate, 4-hydroxybutyl(meth)acrylate, hydroxypropyl(meth)acrylate, pentaerythritol(meth)acrylate, and glycerin(meth)acrylate, in each of which the ester moiety of a (meth)acrylate has a hydroxyl group, are suitably used from the viewpoint of an improvement in adhesion property in the resultant cured product. 2-Hydroxyethyl(meth)acrylate and tetrahydrofurfuryl(meth)acrylate are more suitably used.

The content of the above-mentioned monofunctional (meth)acrylate compounds serving as a reactive diluent is preferably 5 to 200 parts by weight, more preferably 10 to 100 parts by weight with respect to 100 parts by weight of the urethane acrylate-based polymer (A) having a (meth)acryloyl group and a hydroxyl group on side chains thereof. This is because of the following reasons. When the amount of the monofunctional (meth)acrylate compounds added is too small, a sufficient improving effect on the adhesion property of the optical resin adhesive composition is hardly obtained.

In contrast, when the amount is too large, such a tendency that a decrease in viscosity occurs and thus the coating property decreases is observed.

Further, it is effective to add any of various silane coupling agents to the UV-curable optical resin adhesive composition to enhance the adhesion property of the composition particularly when each plate, such as a protective cover plate (front cover), is made of glass or the like in an image display device.

Examples of the above-mentioned silane coupling agent include 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-triethoxysilyl-N-(1,3-dimethyl-butylidene)propylamine, N-phenyl-3-aminopropyltriethoxysilane, N-(vinylbenzyl)-2-aminoethyl-3-aminopropyltrimethoxysilane hydrochloride, 3-ureidopropyltrimethoxysilane, 3-chloropropyltrimethoxysilane, 3-mercaptopropylmethyldimethoxysilane, 3-mercaptopropyltrimethoxysilane, bis(triethoxysilylpropyl)tetrasulfide, and 3-isocyanatopropyltriethoxysilane. Those silane coupling agents may be used alone or in combination of two or more kinds thereof. Of those, 3-methacryloxypropyltriethoxysilane and 3-acryloxypropyltrimethoxysilane are preferably used from the viewpoint of excellent durability in adhesion property with glass.

The amount of the above-mentioned silane coupling agent added is preferably 0.1 to 10 parts by weight, more preferably 0.5 to 5 parts by weight with respect to 100 parts by weight of the total amount of the urethane acrylate-based polymer (A) having a (meth)acryloyl group and a hydroxyl group on side chains thereof, and the monofunctional (meth)acrylate compounds serving as a reactive diluent. This is because of the following reasons. When the amount of the silane coupling agent added is too small, a sufficient improving effect on the adhesion property of the optical resin adhesive composition is hardly obtained. When the amount is too large, such a tendency that a decrease in viscosity occurs and thus the coating property of the composition decreases is observed.

Further, the UV-curable optical resin adhesive composition can be appropriately mixed with any of other additives in addition to the above-mentioned components as required depending on its usage or the like. Examples of the additives include an anti-oxidizing agent, an anti-foaming agent, a surface active agent, a coloring agent, an organic filler, various spacers, and a tackiness/adhesiveness-imparting agent. Those additives may be used alone or in combination of two or more kinds thereof.

The UV-curable optical resin adhesive composition can be produced, for example, by: dispensing a specific urethane acrylate-based polymer (component A), a photopolymerization initiator (component B) and other components; and mixing and kneading them by agitating with a self-revolution type planetary stirring machine or a glass stirring vessel.

The UV-curable optical resin adhesive composition, which can be obtained as described above, is employed in the intended usage in a manner as described below. In other words, as described above, a high viscous composition liquid of the UV-curable optical resin adhesive composition (suitably a composition liquid with a viscosity of 50,000 to 70,000 mPa·s) is applied to the adhesive surface of a panel substrate of one of two plates (hereinafter, also referred to as a first panel substrate) so as to form a dam along the circumference of the adhesive surface. Then, the composition liquid is slightly cured by UV irradiation from a UV LED, a UV lamp such as a high-pressure mercury lamp, or the like. Subsequently, a low viscous composition liquid (suitably a composition liquid with a viscosity of 2,000 to 3,000 mPa·s), in which the UV-curable optical resin adhesive composition is diluted with a monofunctional monomer or the like, is applied to fill the inner peripheral area formed by the above-mentioned dam (inner side of the adhesive surface) of the first panel substrate on which the above-mentioned dam has been formed. After that, the first panel substrate is aligned with another panel substrate (hereinafter, also referred to as a second panel substrate). Subsequently, the panel substrates are bonded together under vacuum or are bonded under ordinary pressure. After that, for example, the composition is cured by UV irradiation from the UV lamp or the like in a manner similar to the above description. Further, after light irradiation such as the above-mentioned UV irradiation, as required, the composition is cured by performing post curing at a predetermined temperature. Thus, the gap between two plates such as the image display panel and the protective cover plate can be filled.

Any of various optical sources known in the art for effectively applying UV such as a carbon-arc lamp, a mercury-vapor arc lamp, an ultra-high pressure mercury lamp, a high-pressure mercury lamp, and a xenon lamp is used as the optical source used for the above-mentioned UV irradiation.

The UV-curable optical resin adhesive composition can be used in the production of a liquid crystal display device with an LCD panel, a protective cover plate (made of glass or the like), and a touch panel-bonding apparatus that are commercially available. In this case, the liquid crystal display device may be constructed by a series of fabrication steps including loading the protective cover plate and the LCD panel, applying an adhesive, bonding the panel and the plate (under vacuum) together, performing pre-curing of the adhesive by UV irradiation, curing the adhesive by UV irradiation, and taking off the resulting product from the apparatus. In particular, the UV-curable optical resin adhesive composition is suitably used in a fabrication process with a manufacturing apparatus having an auto-alignment function.

When something goes wrong in the above-mentioned liquid crystal display device after the construction of the liquid crystal display device, the adhesive layer is cut with the ultrafine wire described in the foregoing to detach the panel and the plate from each other, and then a resin residue remaining on the detached surface is swollen with a solvent and removed from the surface. In general, a nonwoven fabric wiper is saturated with a repairing solvent (swelling solvent) and then placed on the resin residue to swell the resin residue. From the viewpoint of non-erosiveness to nonpolar cycloolefin polymer (COP), the above-mentioned swelling solvent has only to be a non-erosive swelling solvent (repairing solvent) suitably selected from: a ketone-based solvent such as methyl isobutyl ketone (MIBK); an ester-based solvent; an ether-based solvent; a cellosolve-based solvent; and so on. After removal of the resin residue, cleaning with an alcohol-based solvent allows the panels to be brought back to the fabrication process to assemble again.

Here, the UV-curable optical resin adhesive composition is able to control the degree of curing depending on the amount of UV irradiation (cumulative amount of light). Accordingly, a desired wire-cutting strength can be set by previously understanding the relation between the cumulative amount of light and the wire-cutting strength, and hence reworking (repairing) workability can be arbitrarily selected. Further, the conditions for curing the UV-curable optical resin adhesive composition can be estimated by plotting the relation between the cumulative amount of UV and the cumulative amount of heat generation, which allow the curing to exert desired characteristic values. For stabilizing the physical properties of the UV-curable optical resin adhesive composition, it is preferred that the UV irradiation conditions be selected so that the cumulative amount of light corresponding to 90% or more of the cumulative amount of heat generation as a guideline may be achieved.

The UV-curable optical resin adhesive composition can be used for filling the gap between, for example, a liquid crystal display panel and a protective cover plate in a liquid crystal display device. Specifically, as described above, the composition is used as an interlayer filling material for filling, for example, a gap of approximately 0.5 to 1.5 mm between the liquid crystal display panel as an exemplary image display panel and the protective cover plate.

EXAMPLES

Next, examples are described in conjunction with comparative examples. However, the present invention is not limited to these examples.

Example 1

First, 40 g (corresponding to 0.0784 mol of an OH group) of a liquid acrylic polymer having a viscosity of 6,000 mPa·s, a weight average molecular weight of 2,000, and a hydroxyl equivalent (OHV) of 110 mgKOH/g as a vinyl polymer containing a hydroxyl group, 0.15 g (0.00099 mol) of hexamethylene diisocyanate, and 0.66 g (0.00392 mol) of 2-isocyanate ethylmethacrylate were loaded into a reaction container and then kept at 50° C. in a hot water bath under a nitrogen stream. Subsequently, 0.0016 g of dibutyltin laurate (catalyst) (0.2% by weight with respect to the total amount of 2-isocyanate ethylmethacrylate and hexamethylene di-iocyanate) was added to the reaction container, and then the mixture was kept for 8 hours to cause a reaction. After that, infrared absorption spectra (FT-IR spectrometer, type FT-IR 200 manufactured by Thermo Electron Co., Ltd.) were used for confirming disappearance of a peak at 2,260 cm$^{-1}$ for the reaction product (corresponding to the characteristic absorption band derived from an isocyanate group). Consequently, it was found that a urethane acrylate-based polymer (having a weight average molecular weight of 70,000) having a methacryloyl group and a hydroxyl group on side chains thereof was produced.

Next, 10 g of the above-mentioned urethane acrylate-based polymer having a methacryloyl group and a hydroxyl group on side chains thereof was used. In addition, 0.3 g of 3-acryloxypropyl trimethoxysilane was prepared, while 0.3 g of 2,2-dimethoxy-1,2-dihenylethane-1-one (photoradical polymerization initiator) was prepared as a photopolymerization initiator. Then, those compounds were mixed with a planetary stirring/defoaming device under a light-shielding condition. Consequently, a UV-curable optical resin adhesive composition of interest was produced. Here, the viscosity of the optical resin adhesive composition was measured using an E-type rotational viscometer at 25° C. As a result, the optical resin adhesive composition had a viscosity of 40,000 mPa·s (for dam formation).

Subsequently, 8 g of the above-mentioned urethane acrylate-based polymer having a methacryloyl group and a hydroxyl group on side chains thereof was used. In addition, 2 g of 2-hydroxyethyl acrylate as a diluent and 0.5 g of 3-acryloxypropyl trimethoxysilane were prepared, while 0.3 g of 2,2-dimethoxy-1,2-diphenylethane-1-one (photoradical polymerization initiator) to serve as a photopolymerization initiator was prepared. Then, those compounds were mixed with a planetary stirring/defoaming device under a light-shielding condition. Consequently, a UV-curable optical resin adhesive composition of interest was produced. Here, the viscosity of the optical resin adhesive composition was measured using an E-type rotational viscometer at 25° C. As a result, the optical resin adhesive composition had a viscosity of 1,000 mPa·s (for an inner peripheral area formed by a dam).

Example 2

First, 40 g (corresponding to 0.0143 mol of an OH group) of a liquid acrylic polymer having a viscosity of 14,000 mPa·s, a weight average molecular weight of 11,000, and a hydroxyl equivalent (OHV) of 20 mgKOH/g as a vinyl polymer containing a hydroxyl group, 0.60 g (0.036 mol) of hexamethylene diisocyanate, and 0.28 g (0.0018 mol) of 2-isocyanate ethylmethacrylate were loaded into a reaction container and then kept at 50° C. in a hot water bath under a nitrogen stream. Subsequently, 0.0018 g of dibutyltin laurate (catalyst) (0.2% by weight with respect to the total amount of 2-isocyanate ethylmethacrylate and hexamethylene diisocyanate) was added to the reaction container, and then the mixture was kept for 8 hours to cause a reaction. After that, infrared absorption spectra (FT-IR spectrometer, type FT-IR 200 manufactured by Thermo Electron Co., Ltd.) were used for confirming disappearance of a peak at 2,260 cm$^{-1}$ for the reaction product (corresponding to the characteristic absorption band derived from an isocyanate group). Consequently, it was found that a urethane acrylate-based polymer (having a weight average molecular weight of 100,000) having a methacryloyl group and a hydroxyl group on side chains thereof was produced.

Next, 10 g of the above-mentioned urethane acrylate-based polymer having a methacryloyl group and a hydroxyl group on side chains thereof was used. In addition, 0.3 g of 3-acryloxypropyl trimethoxysilane was prepared, while 0.21 g of 1-hydroxy-cyclohexyl-phenyl-ketone and 0.9 g of bis(2,4,6-trimethylbenzoyl)phenylphosphine oxide were prepared as photoradical polymerization initiators. Then, those compounds were mixed with a planetary stirring/defoaming device under a light-shielding condition. Consequently, a UV-curable optical resin adhesive composition of interest was produced. Here, the viscosity of the optical resin adhesive composition was measured using an E-type rotational viscometer at 25° C. As a result, the optical resin adhesive composition had a viscosity of 60,000 mPa·s (for dam formation).

Subsequently, 7.0 g of the above-mentioned urethane acrylate-based polymer having a methacryloyl group and a hydroxyl group on side chains thereof was used. In addition, 3.0 g of tetrahydrofurfuryl acrylate as a diluent and 0.3 g of 3-acryloxypropyl trimethoxysilane were prepared, while 0.21 g of 1-hydroxy-cyclohexyl-phenyl-ketone and 0.9 g of bis(2,4,6-trimethylbenzoyl)phenylphosphine oxide as photoradical polymerization initiators were prepared. A UV-curable optical resin adhesive composition of interest was produced in the same manner as in Example 1 except the foregoing. Here, the viscosity of the optical resin adhesive composition was measured using an E-type rotational viscometer at 25° C. As a result, the optical resin adhesive composition had a viscosity of 3,000 mPa·s (for an inner peripheral area formed by a dam).

Example 3

10 Grams of the urethane acrylate-based polymer having a methacryloyl group and a hydroxyl group on side chains thereof produced in Example 2 described above was used. In addition, 0.3 g of 3-acryloxypropyl trimethoxysilane was prepared, while 0.3 g of 2-hydroxy-1-{4-[4-(2-hydroxy-2-methyl-propionyl)-benzyl]phenyl}-2-methyl-propan-1-one as a photoradical polymerization initiator was prepared. Then, those compounds were mixed with a planetary stirring/defoaming device under a light-shielding condition. Consequently, a UV-curable optical resin adhesive composition of interest was produced. Here, the viscosity of the optical resin adhesive composition was measured using an E-type rotational viscometer at 25° C. As a result, the optical resin adhesive composition had a viscosity of 59,000 mPa·s (for dam formation).

Next, similarly, 7.0 g of the urethane acrylate-based polymer having a methacryloyl group and a hydroxyl group on side chains thereof prepared in Example 2, 3.0 g of isobornyl acrylate as a diluent, 0.3 g of 3-acryloxypropyl trimethoxysilane, and 0.21 g of 1-hydroxy-cyclohexyl-phenyl-ketone and 0.9 g of bis(2,4,6-trimethylbenzoyl)phenylphosphine oxide as photoradical polymerization initiators were prepared. A UV-curable optical resin adhesive composition of interest was produced in the same manner as in Example 1 except the foregoing. Here, the viscosity of the optical resin adhesive composition was measured using an E-type rotational viscometer at 25° C. As a result, the optical resin adhesive composition had a viscosity of 3,400 mPa·s (for an inner peripheral area formed by a dam).

Comparative Example 1

A UV-curable optical resin adhesive composition of interest was prepared in the same manner as in Example 1 except that 8 g of a denatured polybutadiene liquid rubber (3,000 in average molecular weight and 50,000 mPa·s in viscosity) having acrylate polymerizable functional groups on both of its ends and having a polybutadiene as a main chain was used instead of the urethane acrylate-based polymer having a methacryloyl group and a hydroxyl group on side chains thereof.

Comparative Example 2

A UV-curable optical resin adhesive composition of interest was prepared in the same manner as in Example 1 except that 8 g of polyurethane acrylate (10,000 or more in molecular weight and less than 600,000 mPa·s in viscosity) having acrylate polymerizable functional groups on both of its ends was used instead of the urethane acrylate-based polymer having a methacryloyl group and a hydroxyl group on side chains thereof.

The UV-curable optical resin adhesive compositions, which were the products of the examples and the products of the comparative examples and obtained as described above, were subjected to tests for evaluating their various characteristics in accordance with the following methods. The results of the respective tests are listed in Table 1 described later.

<Total Light Transmittance>

A measurement sample was made by preparing two slide glass plates (1 mm in thickness) via a spacer of 100 µm in thickness and bonding them together as described below. That is, when the above-mentioned two slide glass plates are bonded together under vacuum, a dam must deform so that the shape of a dam frame can be naturally fitted by a liquid to be applied to and filled in the inner peripheral area of the dam frame (filling liquid). First, therefore, an optical resin adhesive composition for dam formation was applied to the surface of one of the slide glass plates in a dam frame shape for forming the dam frame. Then, an optical resin adhesive composition liquid for an inner peripheral area formed by the dam was applied to and filled in the dam frame. Subsequently, the above-mentioned dam frame was slightly cured by UV irradiation (with the cumulative amount of light as a UV irradiation condition described in Table 1: not completely cured). Then, the above-mentioned two slide glass plates were bonded together under vacuum. After that, the filled optical resin adhesive composition liquid for an inner peripheral area formed by the dam and the dam frame were completely cured by UV irradiation from a mercury lamp (10 mW/cm$^2$) for 5 minutes (3,000 mJ/cm$^2$ in amount of UV irradiation) through the slide glass plates. Consequently, the measurement sample was produced. Then, the resulting measurement sample was subjected to measurement of a total light transmittance using an NHM-2000 type haze mater manufactured by Nippon Denshoku Industry Co., Ltd.

<Haze>

The same measurement sample as that described above was used and the haze value thereof was measured using the same NMH-2000 type haze meter manufactured by Nippon Denshoku Industry Co., Ltd. as that described above.

<Refractive Index>

The same measurement sample as that described above was used and the refractive index thereof was measured using an NAR-type Abbe's refractometer manufactured by Atago Co., Ltd.

<Cure Shrinkage>

An uncured UV-curable optical resin adhesive composition (for an inner peripheral area formed by a dam) was poured into a measuring cylinder up to the marked line and the weight thereof was measured to determine the specific gravity of the liquid in an uncured state. On the other hand, a measurement sample (cured product) of 3 mm in thickness was produced by curing under UV irradiation so that the cumulative amount of light could reach 3,000 mJ/cm$^2$. Then, the weight of the cured product was measured in water to confirm the specific gravity of the cured product. Those measured values were substituted into the following equation to calculate a cure shrinkage.

Cure shrinkage (%)=[(specific gravity of cured product-specific gravity of liquid before curing)/specific gravity of cured product]×100

<Wire-Cutting Strength>

Two slide glass plates (1 mm in thickness), stacked through a spacer of 650 µm in thickness, were prepared and bonded together as described below to form a measurement sample. That is, when the above-mentioned two slide glass plates are bonded together under vacuum, a dam must deform so that the shape of a dam frame can be naturally fitted by a liquid to be applied to and filled in the inner peripheral area of the dam frame (filling liquid). First, therefore, an optical resin adhesive composition for dam formation was applied to the surface of one of the slide glass plates in a dam frame shape for forming the dam frame. Then, an optical resin adhesive composition liquid for an inner peripheral area formed by the dam was filled in the dam frame. The above-mentioned dam frame was slightly cured by UV irradiation (with the cumulative amount of light as a UV irradiation condition described in Table 1: not completely cured). Then, the above-mentioned two slide glass plates were bonded together under vacuum. After that, the filled optical resin adhesive composition liquid for an inner peripheral area formed by the dam and the dam frame were irradiated with light from an ultra-high pressure mercury lamp (10 mW/cm$^2$) through the slide glass plates in a cumulative amount of light of 100 mJ/cm$^2$ so that the UV-curable optical resin adhesive composition was cured. Consequently, the measurement sample was produced. The resulting sample having the slide glass plates on both sides thereof was subjected to the following measurement. An SUS wire of 500 μm in diameter was used and the wire was pulled in the cross-sectional direction of the cured product, and the rupture strength of the cured product was measured using a push-pull gage (type WPARX-T, manufactured by Shiro Co., Ltd.).

<Swelling Property>

A nonwoven fabric soaked with a solvent (methyl isobutyl ketone) was left on a resin residue on the broken-out slide glass plate obtained as described above at room temperature (25° C.) for a predetermined time (10 minutes in each of Examples 1 to 3 and 60 minutes in each of Comparative Examples 1 and 2). Then, the degree of swelling of the resin residue was evaluated in three stages on the basis of the following criteria.

○: The resin residue was completely swollen.

Δ: 10% or more of the entire area of the resin residue was swollen.

x: Only less than 10% of the entire area of the resin residue was swollen or none of the resin residue was swollen.

<Cleaning Property>

The test sample that was completely swollen per area in the above-mentioned evaluation test for swelling property (evaluated as being ○ in the swelling property test) was wiped with a nonwoven fabric soaked with ethanol, and the result was then evaluated in two stages on the basis of the following criteria. It should be noted that none of the test samples evaluated as being Δ and x in the above-mentioned swelling property evaluation was evaluated.

○: A residue such as a resin residue was not found.

x: A residue such as a resin residue was found.

<Adhesiveness>

A measurement sample was produced by bonding a first slide glass plate (1 mm in thickness) and a second slide glass plate (0.7 mm in thickness) as a protective cover plate prepared with a spacer of 100 μm in thickness therebetween as described below. Another measurement sample was produced by bonding the above-mentioned first slide glass plate (1 mm in thickness) and a second polymethacrylate resin plate (1 mm in thickness) as a protective cover plate prepared with a spacer of 100 μm in thickness therebetween as described below. That is, when the above-mentioned slide glass plate and each protective cover plate are bonded together under vacuum, a dam must deform so that the shape of a dam frame can be naturally fitted by a liquid to be applied to and filled in the inner peripheral area of the dam frame (filling liquid). First, therefore, an optical resin adhesive composition for dam formation was applied to the surface of the first slide glass plate in a dam frame shape for forming the dam frame. Then, an optical resin adhesive composition liquid for an inner peripheral area formed by the dam was filled in the dam frame. The above-mentioned dam frame was slightly cured by UV irradiation (with the cumulative amount of light as a UV irradiation condition described in Table 1: not completely cured). Then, the above-mentioned two plates (the slide glass plate and the protective cover plate) were bonded together under vacuum. After that, the filled optical resin adhesive composition liquid for an inner peripheral area formed by the dam and the dam frame were completely cured by light irradiation from a mercury lamp (10 mW/cm$^2$) for 5 minutes (3,000 mJ/cm$^2$ in cumulative amount of light) through the protective cover plate. Consequently, each of the measurement samples was obtained. Then, the bonding substrate, which was the resulting sample, was left under any of the conditions of: a non-treated state (initial state); being left in a high-humidity incubator (60° C./95% RH) for 6 hours; and being left in the above-mentioned high-humidity incubator (60° C./95% RH) for 100 hours. Then the measurement samples were tested as to whether peeling occurred and evaluated based on the basis of the following evaluation criteria in the three states.

x: Peeling occurred in the initial state.

○: Peeling did not occur in the initial state but occurred within 6 hours when the substrate was left under the 60° C./95% RH environment.

⊙: Peeling did not occur even after leaving under the 60° C./95% RH environment for 1,000 hours.

TABLE 1

|  | Example 1 | Example 2 | Example 3 | Comparative Example 1 | Comparative Example 2 |
|---|---|---|---|---|---|
| Viscosity of coating liquid for dam frame formation (mPa · s) | 40,000 | 60,000 | 59,000 | 41,000 | 30,000 |
| UV irradiation condition for slightly curing dam frame (mJ/cm$^2$) | 300 | 300 | 200 | 300 | 300 |
| Viscosity of coating liquid for inner peripheral surface of dam frame (mPa · s) | 1,000 | 3,000 | 3,400 | 2,000 | 12,000 |
| Total light transmittance (%)* | 99 or more | 99 or more | 99 or more | 99 or more | 99 or more |
| Haze (%) | 0.02 | 0.02 | 0.01 | 0.04 | 0.05 |
| Refractive index | 1.47 | 1.48 | 1.49 | 1.49 | 1.51 |
| Cure shrinkage (%) | 0.5 or less | 0.5 or less | 0.5 or less | 1.2 | 1.5 |
| Wire-cutting strength (N) | 9.7 | 6.5 | 7.7 | 23.2 | 13.3 |
| Selling property — Solvent | Methyl isobutyl ketone (MIBK) | | | | |
| Selling property — Left-standing time (minutes) | 10 | 10 | 10 | 60 | 60 |
| Selling property — Judgement | ○ | ○ | ○ | X | X |
| Cleaning property | ○ | ○ | ○ | Not evaluated | Not evaluated |

TABLE 1-continued

|  |  | Example 1 | Example 2 | Example 3 | Comparative Example 1 | Comparative Example 2 |
|---|---|---|---|---|---|---|
| Adhesiveness | Protective cover plate: slide glass plate | ◎ | ◎ | ◎ | ◎ | ◎ |
|  | Protective cover plate: polymethacrylate resin plate | ○ | ○ | ○ | X | X |

*Value obtained by subtracting the value of the slide glass plate.

As is evident from the above-mentioned results, each of the products of the examples has a high transmittance, a small cure shrinkage, and a small wire-cutting strength, while having excellent swelling property to the solvent. Thus, good evaluation results in terms of cleaning property were obtained. Therefore, it is evident that the products of the examples are excellent in transparency and durability, and suitable for a reworking (repairing) process. Further, both the slide glass plate and the polymethacrylate resin plate showed excellent evaluation results in terms of adhesiveness.

In contrast, each of the products of the comparative examples was excellent in transparency because of its high light transmittance. However, as can be seen from the results, each of the products had a high cure shrinkage and a high wire-cutting strength. Further, even after swelling for a long time period of 60 minutes, the products had low swelling properties to the solvent, resulting in poor cleaning properties. Therefore, it is apparent that the products of the comparative examples are unsuitable for a reworking (repairing) process even though the products have no trouble in transparency. Further, although the slide glass plate showed a good result in the adhesiveness evaluation as in the products of the examples, the result of the polymethacrylate resin plate was such that its adhesiveness was so poor that peeling occurred in the initial stage.

The UV-curable optical resin adhesive composition is useful for an optical filler resin material to be employed for filling a gap between an image display panel and a protective cover plate in an organic EL display device, a liquid crystal display device, or the like.

Although specific forms of embodiments of the instant invention have been described above in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. A UV-curable optical resin adhesive composition for filling a gap between an image display panel and a protective cover plate, comprising:
a urethane acrylate-based polymer (A) having a (meth)acryloyl group and a hydroxyl group on side chains thereof, and
a photopolymerization initiator (B),
wherein the urethane acrylate-based polymer (A) has a weight average molecular weight of 50,000 to 200,000.

2. The UV-curable optical resin adhesive composition according to claim 1, further comprising a monofunctional (meth)acrylate compound as a reactive diluent.

3. The UV-curable optical resin adhesive composition according to claim 1, wherein the urethane acrylate-based polymer (A) having a (meth)acryloyl group and a hydroxyl group on side chains thereof is obtained by reacting a vinyl polymer containing a hydroxyl group on a side chain thereof with (meth)acryloyl group-containing monoisocyanate compounds and a diisocyanate-type compound.

* * * * *